US 6,662,588 B2

(12) United States Patent
Houk et al.

(10) Patent No.: US 6,662,588 B2
(45) Date of Patent: Dec. 16, 2003

(54) MODULAR LIQUID-COOLED AIR CONDITIONING SYSTEM

(75) Inventors: Thomas I. Houk, Winter Park, FL (US); Carroll O. Wright, III, Winter Park, FL (US)

(73) Assignee: Vantage Equipment Corp., Winter Park, FL (US)

( * ) Notice: Subject to any disclaimer, the term of this patent is extended or adjusted under 35 U.S.C. 154(b) by 0 days.

(21) Appl. No.: 09/853,500

(22) Filed: May 14, 2001

(65) Prior Publication Data

US 2002/0166334 A1 Nov. 14, 2002

(51) Int. Cl.[7] .......................... F25D 19/00; F25D 23/00
(52) U.S. Cl. .......................................... 62/298; 62/502
(58) Field of Search ....................... 62/298, 302, 259.2, 62/506

(56) References Cited

U.S. PATENT DOCUMENTS

| | | | | |
|---|---|---|---|---|
| 3,665,727 A | * | 5/1972 | Mather .......................... 62/262 |
| 3,742,725 A | * | 7/1973 | Berger .......................... 62/419 |
| 4,449,376 A | * | 5/1984 | Draper et al. .............. 62/259.1 |
| 4,977,750 A | * | 12/1990 | Metcalfe ........................ 62/77 |
| 5,277,036 A | * | 1/1994 | Dieckmann et al. .......... 62/298 |
| 5,444,990 A | * | 8/1995 | McGill et al. ................. 62/298 |
| 5,582,026 A | * | 12/1996 | Barto ........................... 62/298 |
| 5,927,096 A | * | 7/1999 | Piccione ....................... 62/298 |
| 6,000,458 A | * | 12/1999 | Watanabe ................... 165/11.1 |

* cited by examiner

Primary Examiner—William C. Doerrler
(74) Attorney, Agent, or Firm—Van Dyke & Associates, P.A.

(57) ABSTRACT

A liquid-cooled or air-cooled air conditioning system for corrosive industrial environments is disclosed. The system includes a corrosion-resistant lower or upper cooling module releasably connected to an external source of cool liquid or air and power, and a corrosion-resistant upper or lower blower module releasably connected to an external power source. The two modules are contained within a single corrosion-resistant enclosure. Each module is mounted on a removable frame for placement into either an upper or lower chamber of the enclosure. The system is designed to allow all major air-conditioning components to be quickly disconnected, and removed from the enclosure for maintenance, repair or replacement, on site with minimal work stoppage. The heavy-duty components used increase system durability, reduce component failure, and increase system life ultimately resulting in low cost of ownership. Individual standby modules are kept on-site allowing for immediate interchange of defective modules with to operational modules to minimize downtime related to system maintenance.

25 Claims, 11 Drawing Sheets

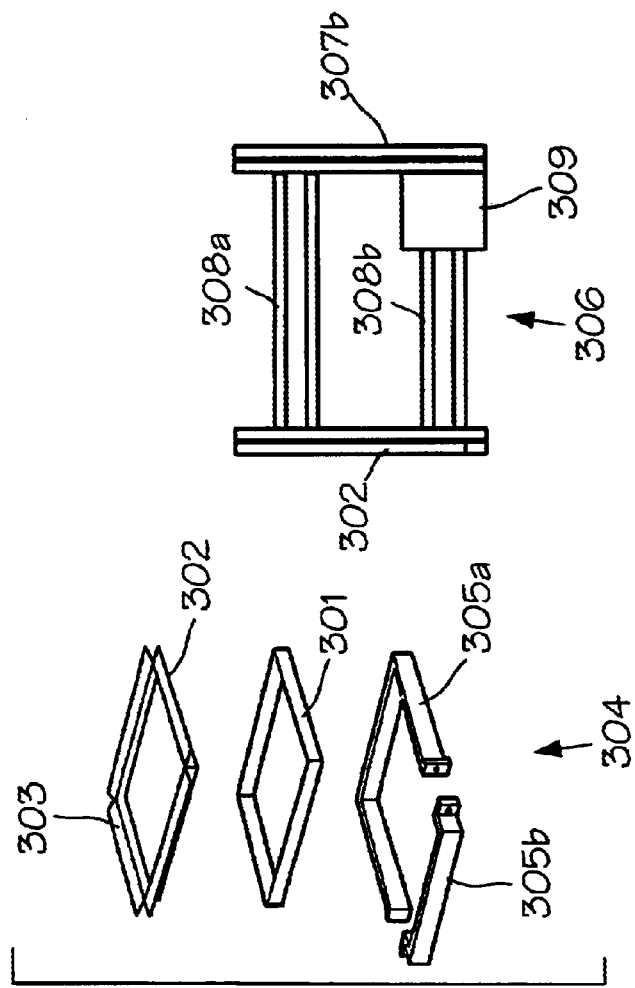
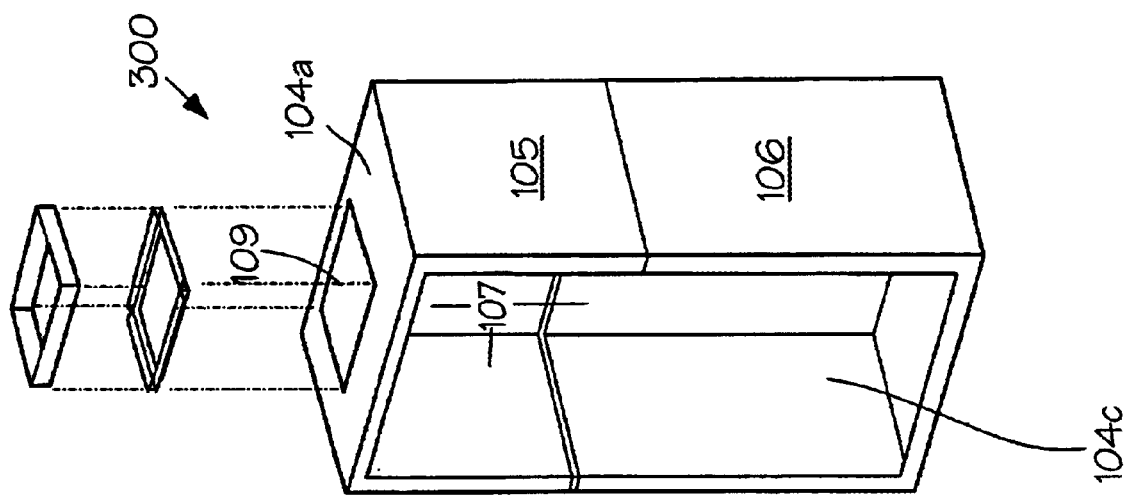
Fig. 3

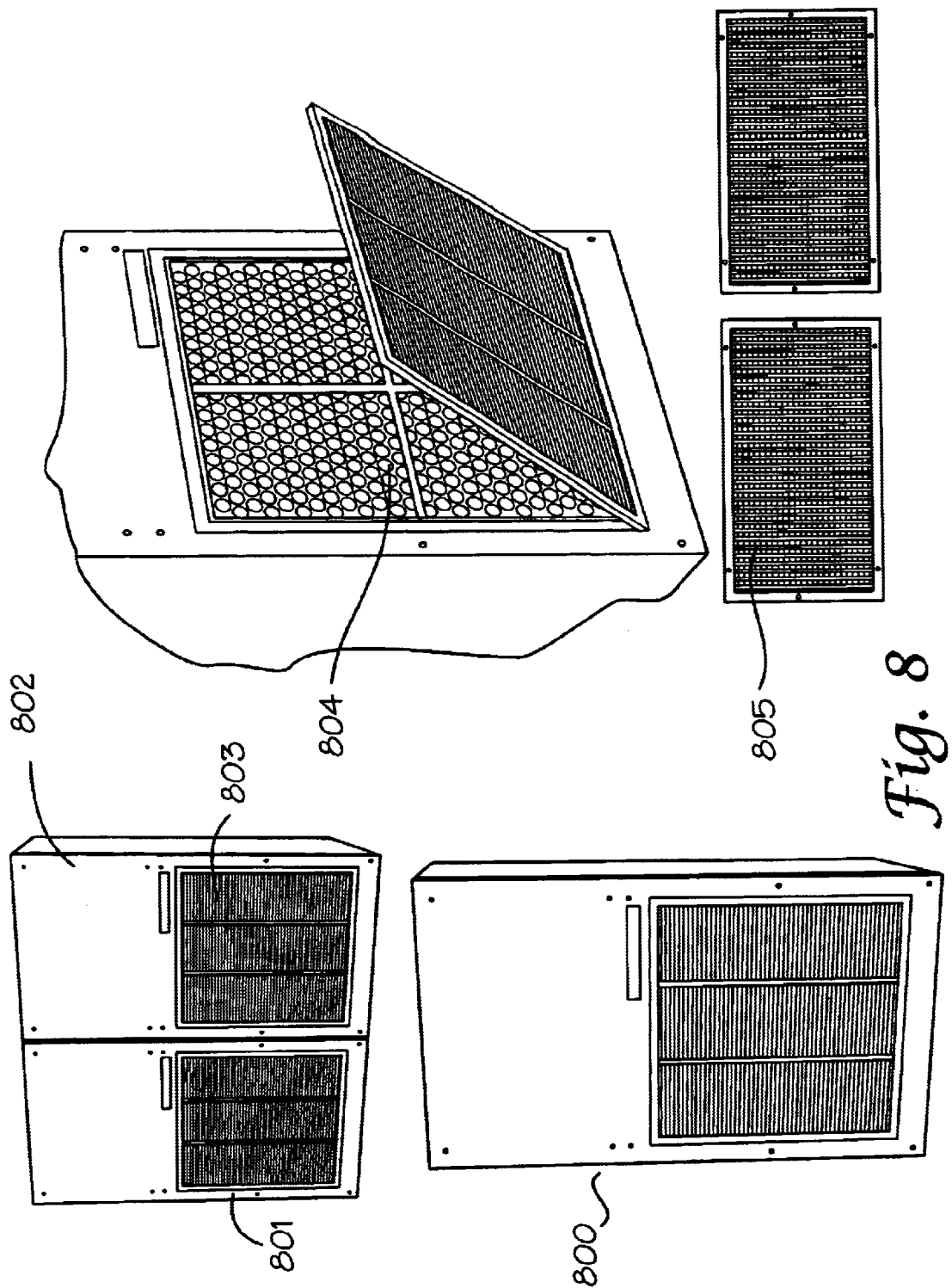

MODULAR LIQUID-COOLED AIR CONDITIONING SYSTEM

FIELD OF THE INVENTION

This invention generally relates to modular air conditioning systems, and more particularly to modular liquid-cooled air conditioning systems for corrosive industrial applications.

BACKGROUND

In work environments where heat production is problematic, such as when furnaces or sources of steam or water are present in the work area, temperature maintenance is critical to the safety of personnel and maintenance of appropriate operating temperatures for equipment, computers and the like. The frequency of accidents in general appears to be higher in hot environments than in more moderate environmental conditions (*Working in Hot Environments*, U.S. Dept. of Health and Human Services Doc. No. S/N 017-03300458-7, 1992). Exposure to a hot work environment can bring about a variety of heat-induced disorders such as heat stroke, heat exhaustion, heat cramps, fainting, heat rash, fatigue or other symptom which may cause workers to overlook safety procedures or to divert attention from hazardous tasks, resulting in injury. Thus, air conditioning systems employed in these environments must be of reliable construction and operation to ensure that a safe environment is sustained throughout a work period.

The problem of maintaining air temperature is more pronounced in hot industrial settings because of the difficulty in maintaining air conditioning systems exposed to corrosive materials. Over time, corrosive substances associated with various manufacturing processes contact and deteriorate materials such as, for example, copper, aluminum, iron etc., that are used to manufacture air conditioning system components. This exposure directly leads to the premature failure of many system components. When conventional industrial air-conditioning systems break down, maintenance usually requires extensive disassembly of the unit to locate and fix the component that has failed. This results in considerable down time for a work facility with a concomitant loss of revenue resulting from decreased productivity, and possible increased liability for work related injuries occurring after a system's failure. Despite these drawbacks, air conditioning systems designed for use in industry have been slow to evolve. The poor structural design and relative inflexibility of industrial systems, i.e. the inability to exchange broken component parts quickly, often results in a protracted maintenance and repair period following system malfunction.

A recent trend in commercial and residential air-conditioning manufacturing has been to make systems that are modular in design and construction. This allows a user to interchange one or more components to fit a desired need, such as, for example, updating the cooling capacity of a unit without having to purchase an entirely new unit, while allowing increased access to one or more system components for repair or replacement. Several patents have issued on air conditioning systems that have modular construction or have one or more removable components. For example, U.S. Pat. No. 5,277,036 issued to Unico, discloses a modular air conditioning unit which comprises individual heating, cooling and blower modules. The system capacity may be adjusted by increasing or decreasing the size of an external condensing unit. However, the system does not offer removable assemblies of components in single operational units that may be readily interchanged on site to reduce down time.

U.S. Pat. No. 5,485,878, issued to Bard, discloses a heating, ventilation, and air conditioning (HVAC) system which is capable of receiving interchangeable ventilation modules having varying degrees of mixing abilities. However, the flexibility of that system is restricted in that it only allows interchange of ventilation modules. No other components are interchangeable, and therefore when a main component (e.g. blower, motor, compressor etc.) breaks down the entire system becomes inoperable until repaired. Numerous other patents have issued for air conditioning systems designed with removable panels for maintenance, or having one or more interchangeable or removable components.

Notwithstanding the variety of air conditioning systems available, no system currently available has adequately addressed the problems associated with system breakdown and repair in an industrial environment where maintenance of temperature is essential to the safety and productivity of a work force and maintenance of temperature for equipment operating requirements. A need therefore remains in the field for a system that is: capable of efficiently cooling an industrial work environment, constructed of materials impervious to corrosive materials commonly associated with industrial manufacturing processes, and designed for quick, on-site, repair and return to service. The present invention provides a modular system whereby heavy-duty, corrosion resistant components are mounted on easily releasable framed modules, such that when one component or an entire system fails, the existing framed module containing the failed component can be quickly exchanged with an identical, standby, framed module containing a fully operational set of components. The framed, standby, modules may be stored on-site to expedite the return to service of a system. In this way, downtime is minimized, productivity is maintained, and maintenance, repair or replacement of the broken component can be done at non-critical times.

BRIEF DESCRIPTION OF THE DRAWINGS

FIG. 3 is a side view schematic representation of a cabinet housing of the modular liquid-cooled air conditioning system of the present invention showing a blower duct assembly and blower support frame.

FIG. 8 is a picture of a single and double unit modular liquid-cooled air conditioning system of the present invention.

SUMMARY OF THE INVENTION

Figure 1:
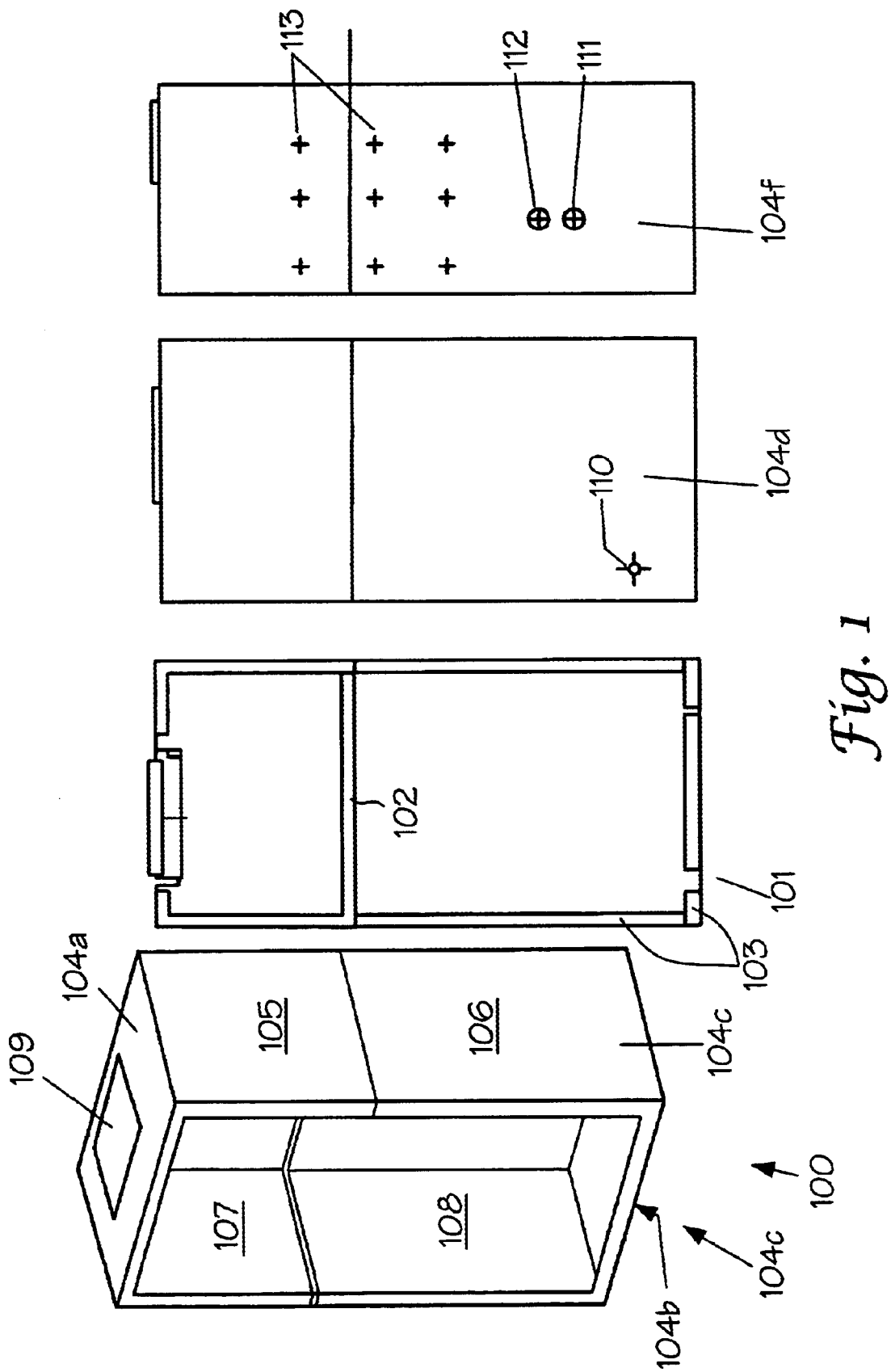
FIG. 1 is a schematic representation of one embodiment of a cabinet housing of an example of the modular liquid-cooled air conditioning system that embodies the present invention.

The present invention is a modular, liquid-cooled or air-cooled air conditioning system for use in corrosive industrial environments. In general, the system includes a first removable framed cooling module releasably connected to an external source of cool liquid and power, and a second removable framed blower module releasably connected to an external power source. The two modules are contained within a single enclosure and are designed for quick, easy disconnection and replacement of either the upper or lower or both modules, to minimize down time due to malfunction of components included in either or both modules, with identical standby modules. The system is made from a material such as, for example, cupronickle trombone, stainless steel plate, marine stainless steel plate, galvanized steel, or a polymeric composition, which is impervious to corrosive materials, such as, for example strong acids or strong bases, commonly associated with a manufacturing process. All system components are mounted on quick-release, slide-out frames to allow for fast, easy installation, maintenance and replacement of modules. Framed standby modules are kept on-site for quick replacement of modules with defective components, allowing for the rapid return of the unit to operation. Repair can be done on-site or in the shop at non-critical times. The system is adaptable to a range of cooling capacities. Air or water flow per unit of cooling capacity will vary depending upon the particular application. For example, evaporator air flow may be in the range of 400 cfm/ton of cooling, condenser airflow may be in the range of 700 cfm/ton of cooling, and condesor water flow may be in the range of 3 GPM/ton of cooling. The entire system operates over standard power supply. Internal system components such as, for example, the compressor, condenser, evaporator, motor etc., are generally conventional in construction and operation, and may be made from heavy-duty, corrosion-resistant materials. Each component may be obtained from a number of manufacturers and distributors allowing a user to custom design a system to fit a particular need. Because of its durable, modular construction, the present invention has numerous applications as described herein.

Accordingly, it is one object of the present invention to provide an improved modular liquid-cooled or air-cooled air conditioning system for industrial work environments.

Another object of the present invention is to provide a modular air conditioning system that allows for easy exchange of complete inoperative modules with complete operational modules to minimize maintenance-related downtime, and thus maintain workplace productivity.

Another object of the present invention is to provide a modular air conditioning system that may be adapted to provide a range of cooling capacities.

Another object of the present invention is to provide a modular air conditioning system for use in a corrosive environment.

Another object of the present invention is to provide a modular air conditioning system adapted to be repaired immediately on site.

Another object of this invention is to provide a long-lasting, low-cost modular air conditioning system for industrial or commercial applications.

Another object of this invention is to provide a modular air conditioning system that is efficient in operation, and well adapted for long-term use.

Further objects and advantages of this invention will become apparent from the complete disclosure and the claims appended hereto.

DETAILED DESCRIPTION

This invention is an air conditioning system for use in a corrosive industrial or other workplace. Liquid-cooled systems are contemplated, such as, for example, water-cooled systems capable of rapidly absorbing heat from another material to which it is placed in close proximity. Air-cooled systems are also contemplated, where water-cooling is impractical, impossible or undesirable. By corrosive is meant any strong acidic or basic substance, product or by-product of an industrial process that exists under ambient conditions as a corrosive gas, dust, or liquid and which possess the ability to deteriorate metal, metal soldering, electrical wiring, brushings, bearings, or polymeric materials used in the manufacture of air conditioning system components, when contacted therewith. By corrosion-resistant coating material is meant Heresite, Bronzeglow, Adsil or other material containing a chemical composition sufficient to neutralize the action of a corrosive substance on a system component. By industrial workplace is meant any work environment where temperature maintenance is problematic such as, for example, paper and pulp mills, chemical plants, metal foundries, brick firing and ceramics operations, glass product manufacturing plants, rubber products manufacturing plants, boiler rooms, bakeries, restaurant, kitchens, laundries, food canneries, mines, smelters, steam tunnels or similar environments where elevated temperatures can create hazardous conditions for workers or operating equipment.

Reference is now made to the drawings, which show various embodiments of an air conditioning system. FIG. 1 is a schematic view of a cabinet housing which encases a modular, liquid-cooled air conditioning system of the present invention. The cabinet, generally shown at 100, is made from any durable material capable of withstanding continued exposure to a corrosive atmosphere, but preferably is made from galvanized or stainless steel. In a preferred embodiment, stainless steel angle braces are used to construct the shell 101 of the cabinet 100. Horizontal 102 and vertical 103 angle braces are welded or otherwise affixed to each other, such that the resulting shell 101 of the cabinet 100 is generally in the form of a rectangle with top 104*a*, bottom 104*b*, front 104*c*, rear 104*d*, left 104*e* and right 104*f* sides. The cabinet 100 is divided into an upper cabinet 105 and a lower cabinet 106 separated by horizontal angle braces 102 on all four sides. Three sides of the cabinet; rear 104*d*, left 104*e*, and right 104*f*, along with both the top 104*a* and bottom 104*b* section are covered by a sheet (see generally FIG. 9) of non-corrosive metal or other material along both the upper cabinet 105 and lower cabinet 106 sections. The covering is welded or otherwise affixed to the horizontal 102 and vertical 103 angle braces that define the shell 101 of the cabinet 100. In use, the front section 104*c* of the upper cabinet 105 is covered with an easily removable sheet of metal 802 (see FIG. 8). In use, the front section 104c of the lower cabinet 106 is covered by a louvered panel 803 (see FIG. 8) to allow for intake of fresh air into the system. Both the front upper cabinet cover 802 (see FIG. 8) and the front lower cabinet cover 803 (see FIG. 8) are affixed to the main cabinet 100 by quick-release fixation devices such as screws, hex-nuts, butterfly nuts, spring mounts, or other devices which allow a user to quickly remove one or both of the covers. Upon removal of the front upper cabinet cover, an upper chamber 107 is revealed which is capable of receiving, for example, a framed upper blower module 715 (see FIG. 7b), generally comprising a blower and motor. Upon removal of the front lower cabinet cover a lower chamber 108 is revealed which is capable of receiving, for example, a framed lower cooling module 716 (see FIG. 7b) generally comprising a condenser, compressor, cooling coil, and evaporator. The framed upper blower unit 715 (see FIG. 7b) is designed such that the entire unit slides easily into the upper chamber 107 along an horizontal plane. The framed lower cooling unit 716 (see FIG. 7b) is similarly designed to easily slide into the lower chamber 108 along an horizontal plane. A hole 109 is cut out of the top panel 104a of the cabinet 100 to receive a portion of a blower (not shown) housed in the framed upper blower unit 715 (see FIG. 7b) placed inside the upper chamber 107. A hole 110 is cut through the lower quadrant of the rear section 104d of the lower cabinet 106 to expel condensate from a pipe drain (see generally FIG. 6). On either the right side 104f or left side 104e of the lower cabinet 106 two holes are cut, an intake 111 to receive cooling fluid from an external cooling system (not shown), and an outlet 112 to release heated fluid (not shown) back into the external cooling system. Positioned on the right side 104f or left side 104e panel extending between the upper 105 and lower 106 cabinets, a plurality of holes 113 exist to accept NEMA type electrical enclosures 900 (see FIG. 9) to house exterior electrical wiring and couplings. A thermostat 901 (see FIG. 9) is attached to the outside of the NEMA enclosure 900 if desired. The exact orientation of the cabinet and frame may be altered to fit a desired need. For example, the top and bottom cabinets could be reversed such that the blower and cooling units are reversed. All internal system components are affixed to either the upper or lower framed units, and are releasably connected to external sources of liquid or air coolant and/or power. The major components, such as, for example, condenser, compressor, evaporator, cooling coil, etc., are of conventional design and operation. If used in an industrial application, each component is constructed of corrosion resistant material, such as, for example, cupronickle trombone, stainless steal plate, marine stainless steel plate, galvanized steel, or polymeric compositions. Alternatively, the components may be coated with a corrosion resistant material.

Figure 2:
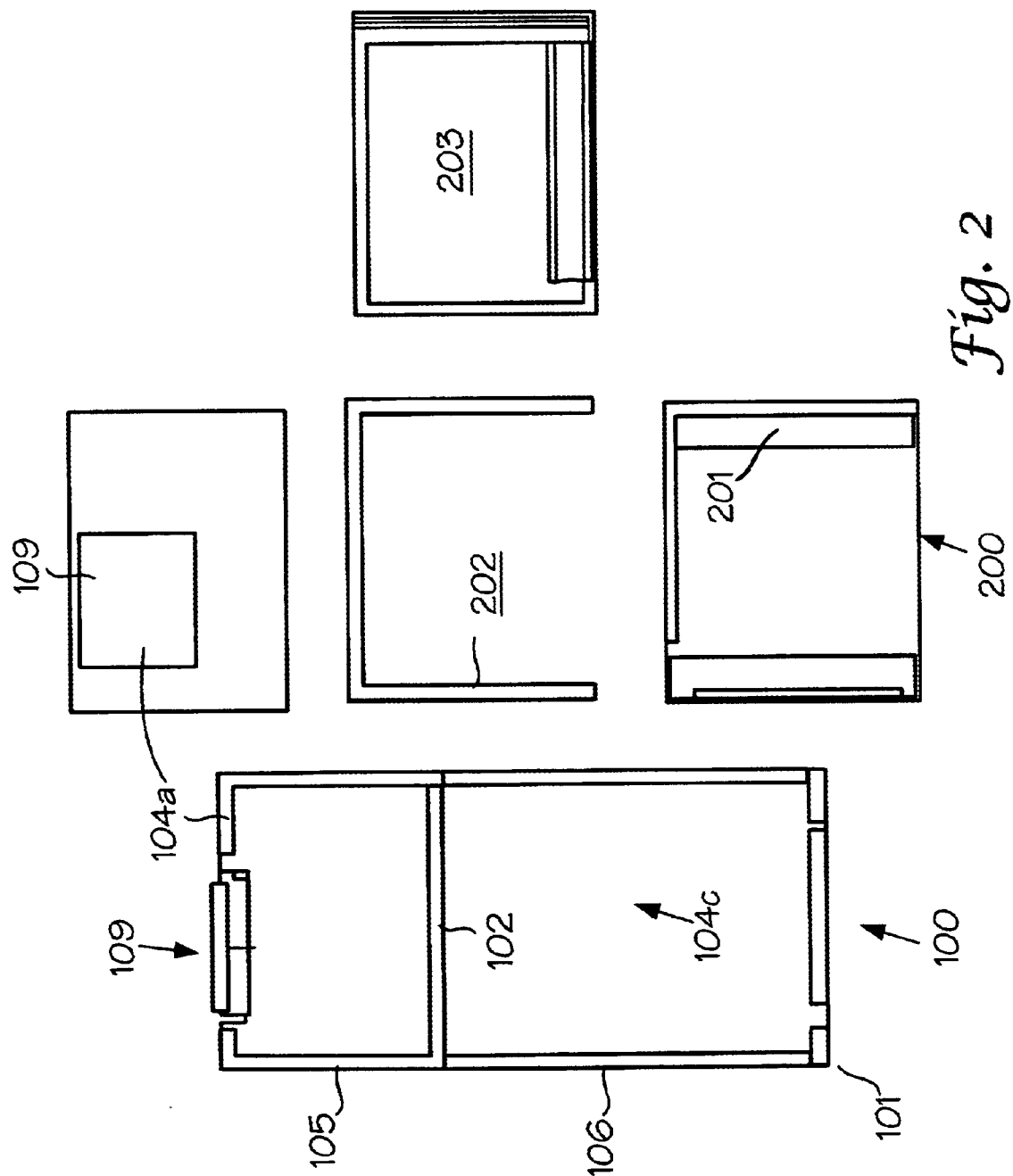
FIG. 2 is a schematic representation of a shell for a cabinet housing of the modular liquid-cooled air conditioning system that embodies the present invention.

FIG. 2 shows one embodiment of the shell 101 of cabinet 100 of the present invention which includes a hole 109 cut out of the top 104a panel of the upper cabinet 105. One embodiment of a bottom cabinet base support 200 is shown configured with a top hat design edge 201 to allow for easy in and out movement of a framed lower cooling unit 716 (see FIG. 7b). A top angle brace 202, configured to have three sides, acts as an upper support base and is welded or otherwise affixed to the upper portion of the lower cabinet 106 in contact with the lower portion of the horizontal angle brace 102, such that the open section of the brace 202 faces the front section 104c of the cabinet 100. The absence of a front section of the angle brace permits easy movement of the framed lower cooling unit during maintenance, repair or replacement. One embodiment of a blower support base 203 for placement within the upper cabinet chamber is also shown. The blower support base 203 is welded or otherwise affixed to the upper portion of the horizontal angle brace 102 and supports the framed upper blower module 715 (see FIG. 7b) placed in the upper chamber 107.

FIG. 3 shows a schematic side profile of one embodiment of a single unit cabinet of the present invention. A duct assembly is generally indicated at 300 for communication with a blower 717 (see FIG. 7b). The duct assembly 300 comprises a duct attachment collar 301 and a duct assembly reinforcement component 302. The top ridge 303 of the duct assembly reinforcement component 302 is bent at a ninety degree angle such that when placed into the hole 109, it covers the entire opening cut into the top panel 104a of the upper cabinet 105 and embraces a portion of a blower unit 717 (see generally FIG. 7b) placed inside the chamber 107 of the upper cabinet 105. The duct attachment collar 301 is fitted into the duct assembly reinforcement component 302 to create a firm seal between the end of the blower 717 (see FIG. 7b) and the opening in the top panel 104a of the upper cabinet 105. A blower connection apparatus is generally indicated at 304 consisting of a blower frame attachment bracket 305a and blower frame attachment harness 305b. A connection is made between the end of the blower 717 (see FIG. 7b) and the blower frame assembly on the underside of the top panel 104a of the upper cabinet 105. The blower connection apparatus 304 is placed in communication with the duct assembly 300, such that conditioned air released from the blower is expelled through the opening to the exterior environment. A blower support base 203 (see FIG. 2) is affixed between the upper 105 and lower 106 cabinets to support the framed blower module 715 (see FIG. 7b). A slidably mounted blower frame assembly 306 is shown comprising right 307a and left 307b vertical side slide supports attached to upper 308a and lower 308b horizontal supports. The blower frame assembly 306 is mounted on top of the blower support base 203 (see FIG. 2). In use, the frame houses a blower motor 718 (see FIG. 7b) attached directly to a blower 717 (see FIG. 7b) through a pulley, chain, belt, or like system (see generally FIG. 7b). Air circulation through the system is preferably accomplished by a squirrel cage type centrifugal blower 717 (see FIG. 7b), but any conventional blower may be used within the system with appropriate modifications. The blower 717 (see FIG. 7b) is affixed to the blower frame assembly 302 through quick release mechanisms, such as for example screws, hex nuts and the like to allow easy removal from the framed assembly. A motor 718 (see FIG. 7b), is supported by a motor mount apparatus 309 welded to or otherwise affixed to the blower frame assembly 306. The motor 718 (see FIG. 7b) may be a multi-speed unit to provide airflow adjustments for high and low static operation, or a single speed unit depending on the particular requirements of the environment.

Figure 4:
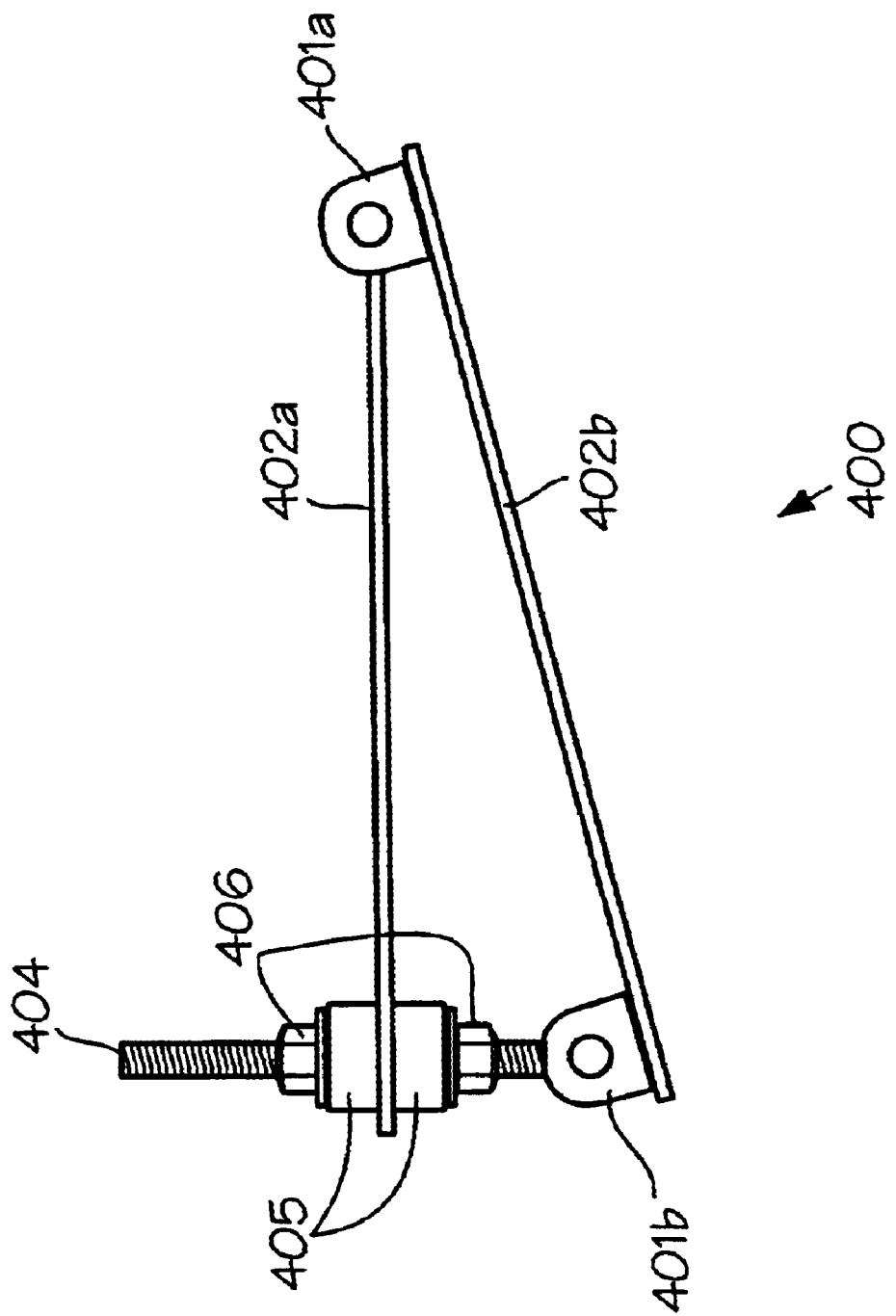
FIG. 4 is a schematic representation of a blower motor mount of the modular liquid-cooled air conditioning system of the present invention.

FIG. 4 shows a motor mount apparatus generally indicated at 400 for attachment of a blower motor 717 (see FIG. 7b) to minimize vibrational noise associated with motor operation. A distal (considered to be that portion facing the interior of the cabinet) cleat 401a attaches a top motor mount plate 402a to a bottom motor mount plate 402b. On the proximal end, a continuous thread rod 404 runs though the top motor mount plate 402a and is affixed to the bottom motor mount plate 402b by way of a cleat 401b containing the continuous thread rod 404. Attached to the continuous thread rod are heavy-duty vibration dampers 405 located above and below the top motor mount plate 402a, each held in place by heavy-duty hex nuts 406. Adjustments to the angle of the motor mount 400 are made by adjusting the rod 404 and hex nuts 406. In use a motor 718 (see FIG. 7*b*) is affixed to the continuous thread rod 404 such that the base of the motor rests on the top motor mount plate 402*a*.

Figure 5A:
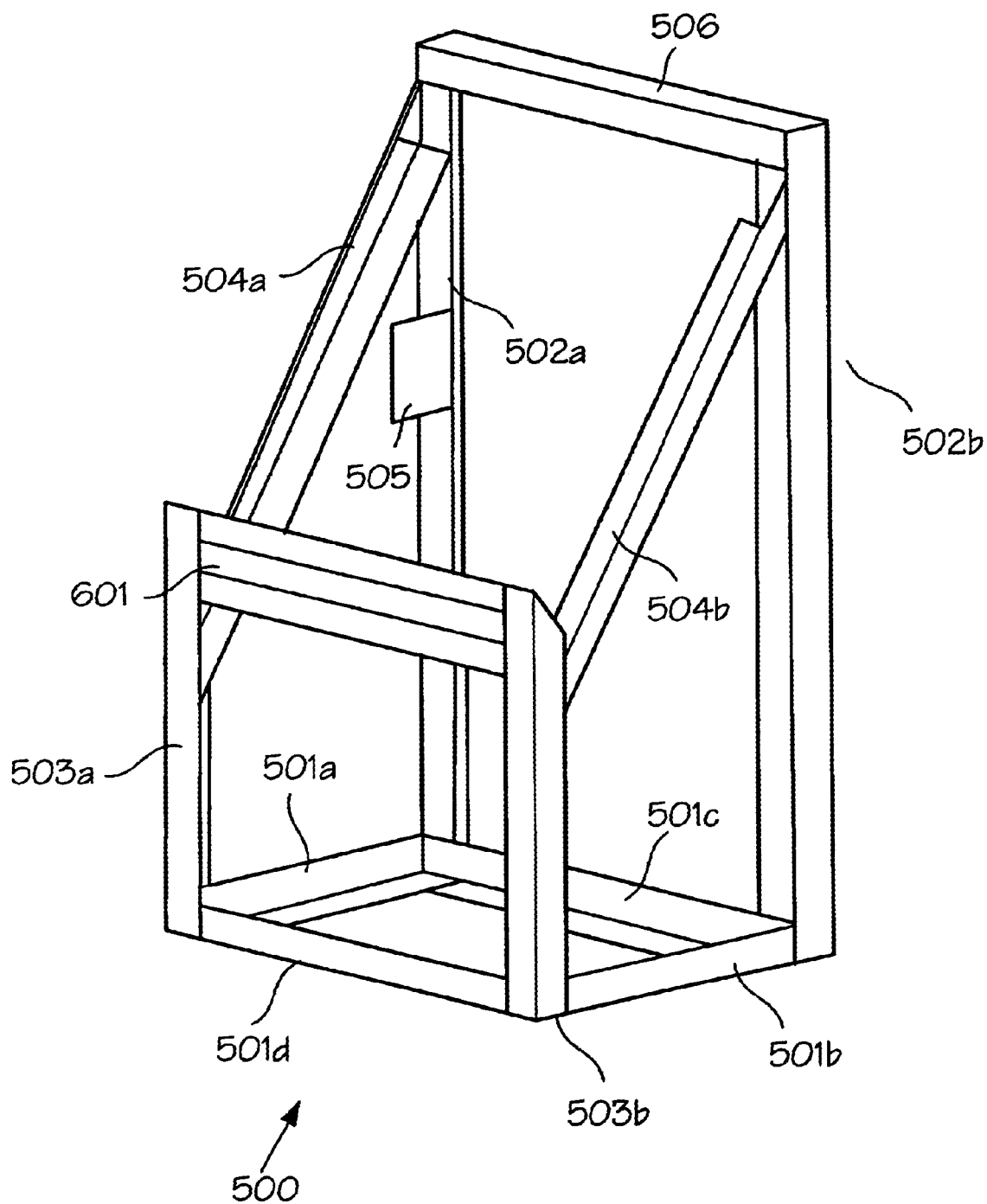
FIG. 5a is a schematic representation of a cooling unit frame assembly of the modular liquid-cooled air conditioning system of the present invention.

FIG. 5*a* shows several views of a cooling module frame generally indicated at 500, of the present invention. The frame 500 is designed to be slidably mounted on an interior support base 200 (see FIG. 2). The frame 500 has a bottom support composed of four metal angle braces, left 501*a*, right 501*b*, front 501*c* and rear 501*d* which are welded together or otherwise affixed at right angels to one another such that a square or rectangle shape results. Rising perpendicularly from the corners of the bottom angle braces are two front angle braces, left 502*a* and right 502*b* and two rear angle braces, left 503*a* and right 503*b*. The two front, left 502*a* and right 502*b*, perpendicular angles braces are configured to be sufficiently longer than the two rear perpendicular angles braces, left 503*a* and right 503*b*, to create an incline rising from the rear perpendicular angle braces to the front perpendicular angle braces. A left cross angle brace 504*a* is placed between the front left perpendicular angle brace 502*a* and the rear left perpendicular angle brace 503*a*, such that the cross angle brace 504*a* forms roughly a forty-five degree angle with the front left perpendicular angle brace 502*a*. Similarly, a right cross angle brace 504*a* is placed between the front right perpendicular angle brace 502*b* and the rear right perpendicular angle brace 503*b*, such that the cross angle brace 504*b* forms roughly a forty-five degree angle with the front right perpendicular angle brace 502*b*. Both cross angle braces 504*a* and 504*b* are oriented such that one edge of the brace faces the interior of the frame, and the other is bent at a ninety-degree angle toward the exterior of the frame. This orientation allows for placement and support of a cooling coil assembly 710 (see FIG. 7*a,b*). An electrical junction box bracket 505 is placed on the interior edge of the front left perpendicular angle brace 502*a* to allow for placement of an interior electrical panel (not shown). A drip pan 601 (see FIG. 6 for detail) is placed horizontally between the right rear 503*a* and left rear 503*b* perpendicular angle braces such that the drip pan 601 (see FIG. 6) is positioned at the lower edge of the cooling coil assembly to receive condensate that accumulates on the cooling coil.

Figure 5B:
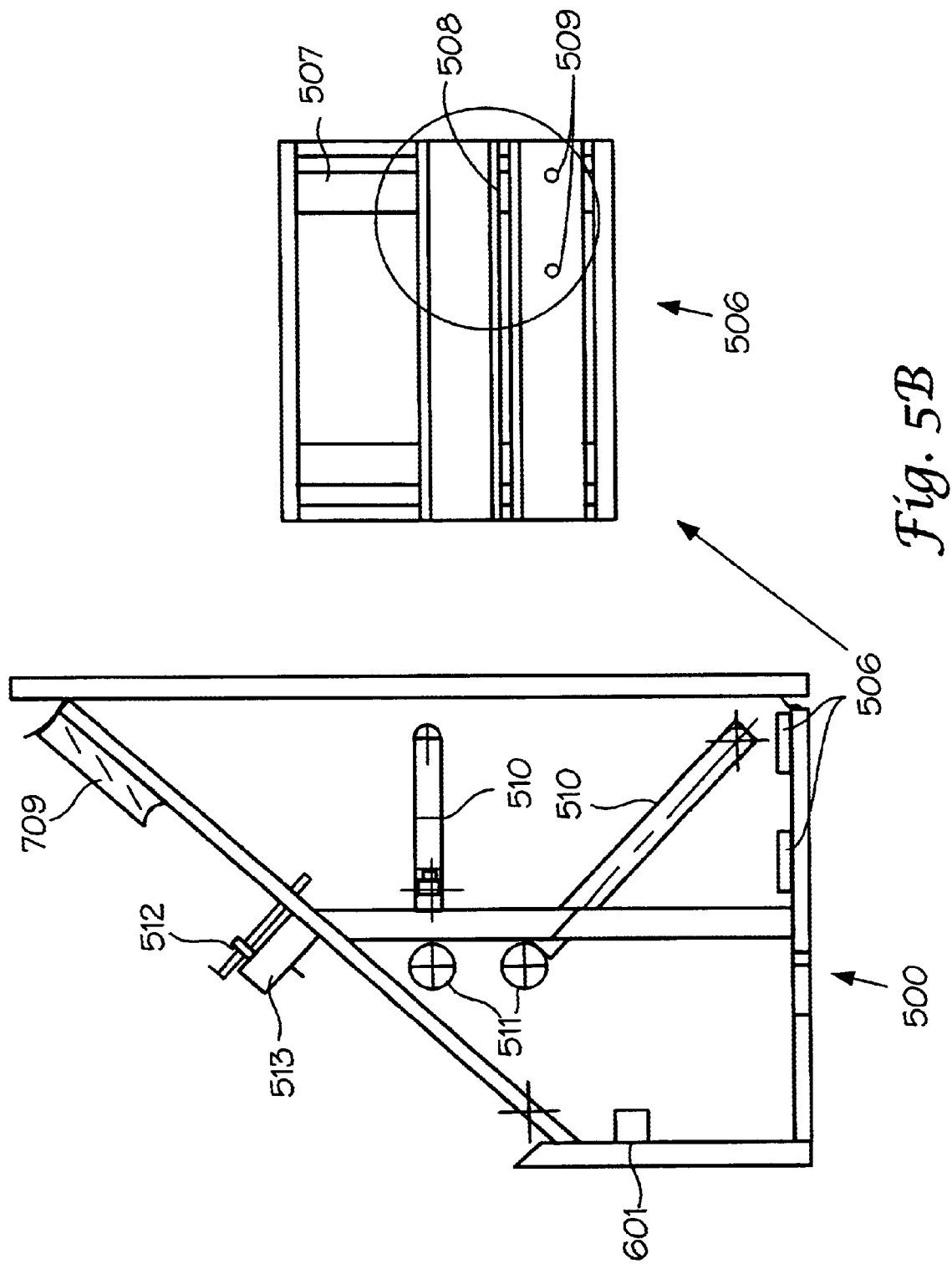
FIG. 5b is a right elevation schematic representation of the modular liquid-cooled air conditioning system of the present invention showing a cooling unit frame with a condenser/compressor frame mount.

FIG. 5*b* shows a right elevation of the lower frame 500 assembly showing a compressor and condenser support 506. The compressor/condenser support 506 lies horizontal to the ground and is affixed to the bottom portion of the lower unit frame. The support is generally composed of flat metal sheets 507 and 508 crossed over one another and has a plurality of drilled compressor bolt holes 509 to allow fixation of the compressor unit to the floor of the lower frame unit to minimize movement. Copper tubing 510 is disposed within the lower frame for attachment of refrigerant material to system components, and to allow for attachment of external liquid coolant to the unit. Two pipe tee reducers 511 are affixed to the copper tubing 510 to allow water pipes to pass completely through the unit if multiple units are installed in parallel. If a single unit is installed, the extra port on the pipe tee reducer 511 is sealed. A clamp 512 for holding copper tubing 510 is shown mounted on a support channel 513.

Figure 6:
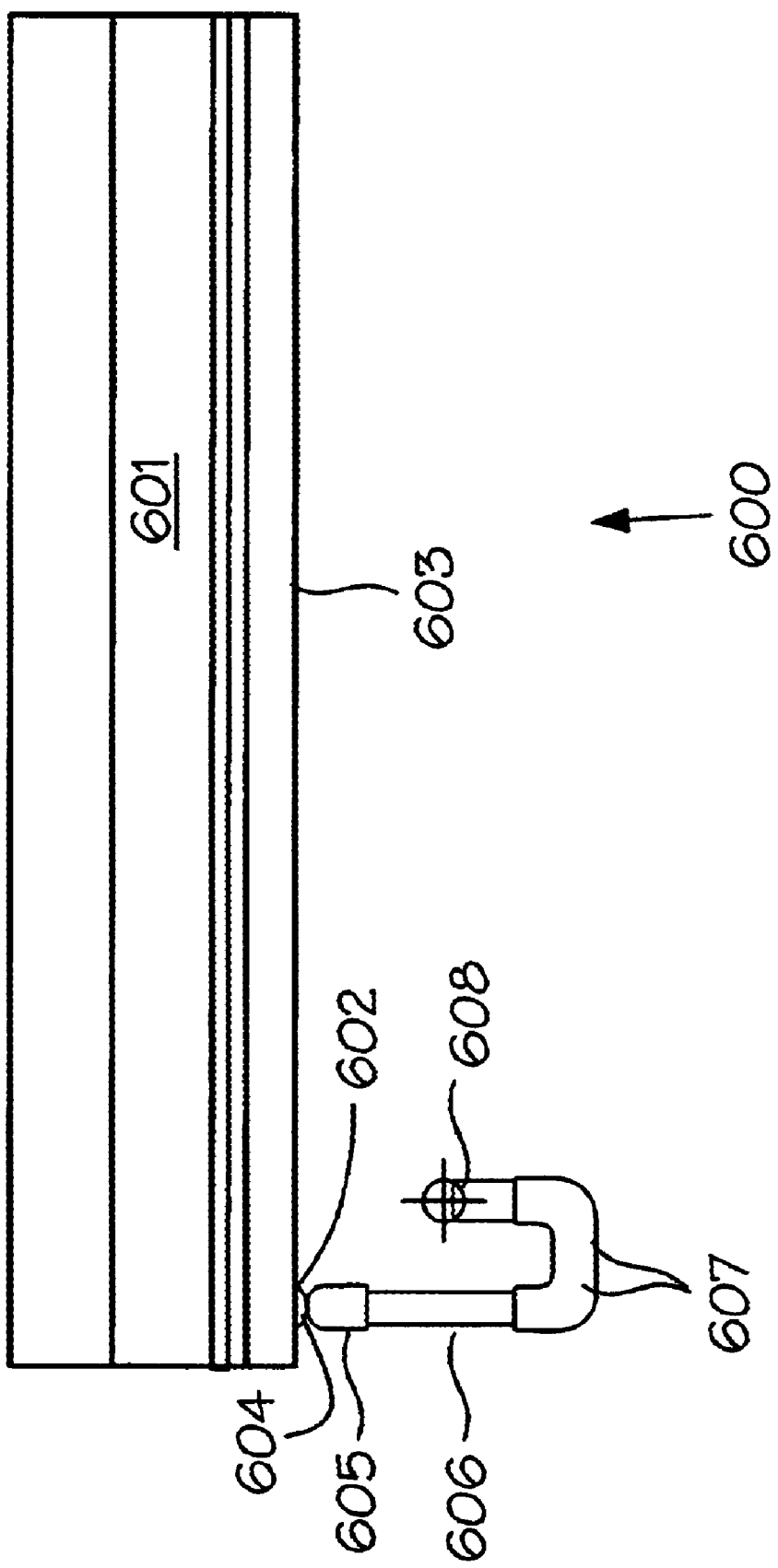
FIG. 6 is a front view schematic representation of a drip pan of the modular liquid-cooled air conditioning system of the present invention.

FIG. 6 shows a drain trough generally indicated at 600 comprising drip pan 601 and associated plumbing fittings. The drip pan 601 has a drain connector for connection to drain hose which carries away condensation formed on the cooling coil assembly 710 see FIGS. 7*a,b*) during cooling operation of the system. The drip pan 601 is generally in the shape of a trough or box. A hole 602 is cut in the base 603 of the drip pan 601 wherein a nipple thread 604 is welded or otherwise affixed thereto. An adapter pipe 605 is affixed to the nipple thread 604. Affixed to the adapter pipe 605 is a straight pipe 606, and a series of elbows 607 fabricated to line up with the drain hole 110 (see FIG. 1) on the back of the cabinet 100 (see FIG. 1).

Figure 7A:
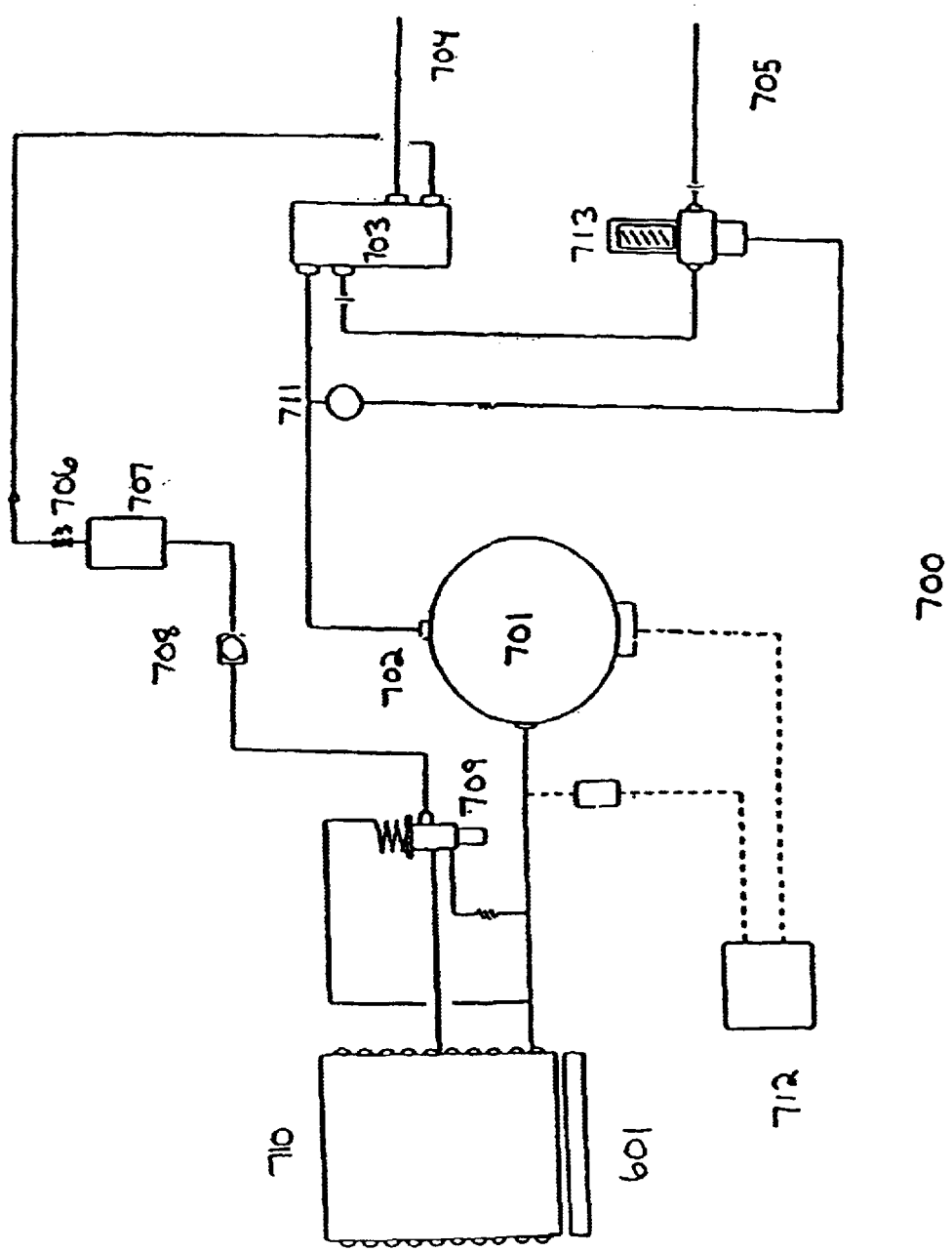
FIG. 7*a* is schematic flow diagram of the modular liquid-cooled air conditioning system of the present invention.

FIG. 7*a* shows a schematic flow diagram for the system indicated at 700. In general, warm air is drawn into the system by a blower and motor apparatus by convective current through a louvered door and filter, past a cooling coil/evaporator system, which removes heat from the air and subsequently passes the then cool air through the blower and out to exterior of the structure. In one embodiment of the present invention, a compressor 701 does work on Freon gas, thereby increasing the pressure on the gas. As the pressure increases, so does its temperature. Freon flows through the system via a series of pipes generally indicated by a system pipe 702. High-pressure, high-temperature Freon gas exits the compressor 701 through system pipe 702 and enters an internal water-cooled or air-cooled condenser 703. Chilled water or air from an external source is drawn into the condenser 703 through an intake pipe 704. The intake pipe 704 communicates with and runs parallel with, but in opposite direction to, the system pipe 702 inside the condenser unit. This orientation allows for the quick exchange of heat from the Freon to the water through countercurrent exchange mechanisms known in the field. The then heated water or air is released back into the environment through an outlet pipe 705 to liberate the heat absorbed. The heat lost by the Freon causes the high-pressure gas to condense to a liquid. The liquid Freon then passes out of the condenser 703, and through a pump down valve (expansion valve) 706 which decreases its pressure and hence temperature. The liquid then passes through a filter dryer 707 and may be viewed through a site glass 708 to check that a complete phase change (gas to liquid) has occurred, as evidenced by the absence of bubbles. The Freon liquid is then run through an evaporator 709 and cooling coil assembly 710 where, under reduced pressure, it boils and begins absorbing heat from the hot air passing over the cooling coil assembly 710. Heat from the air passing over the coil 710 is thereby transferred to cool Freon running internally through the coil system 710 causing the temperature of the air to rapidly decrease. Moisture from warm air that contacts the coil 710, condenses, drips into a drip pan 601, and drains out by way of an external valve (see generally FIG. 6). Through continued absorption of heat from the air passing over the coil system, the intermolecular bonds of liquid Freon circulating interiorly, break causing expansion and vaporization to occur, thus slowly decreasing its heat absorption capacity. Freon vapor is then drawn through the compressor 701 and compressed back into a hot, high-pressure gas, and the cycle repeats. The cycle described above does not run continuously, but rather is controlled by a thermostat generally shown at 711. When the temperature outside rises above the set temperature, the thermostat starts the compressor 701. Once the air has been cooled below the set temperature, the compressor 701 is turned off. One particular advantage of the current invention is the use of an external liquid coolant, such as, for example, water or air to cool the condenser. This provides an inexpensive, continuous supply of cooling material which is naturally recharged by the environment. Additionally, use of an external cooling source allows for the placement of a condenser internally, which in turn increase the flexibility of the system by increasing the placement options available. Other systems generally use condensers mounted outdoors which may limit a system's placement. The present system may operate over a range of cooling capacities by employing different sized condensing units having different cooling capacities. Generally, the capacity of the condensing unit is selected according to industry standard guidelines of the cooling load of the structure to be conditioned. The preferred set up of the present invention comprises an upper and lower unit matched with a 7.5 or 10 ton condensing unit or matched with a 15–20 ton double unit for greater cooling capacity. The power source 712 is mounted on the exterior for ease of access. A refrigerant pressure activated water valve, i.e. throttling valve, 713 ensures that proper condenser pressure is maintained when the water is cold. If the condenser pressure drops too far, performance of the entire unit may be compromised and evaporator freeze-up becomes possible. The throttling valve 713 senses a drop in condenser pressure and restricts the water flow to maintain a desired minimum condenser pressure.

Figure 7B:
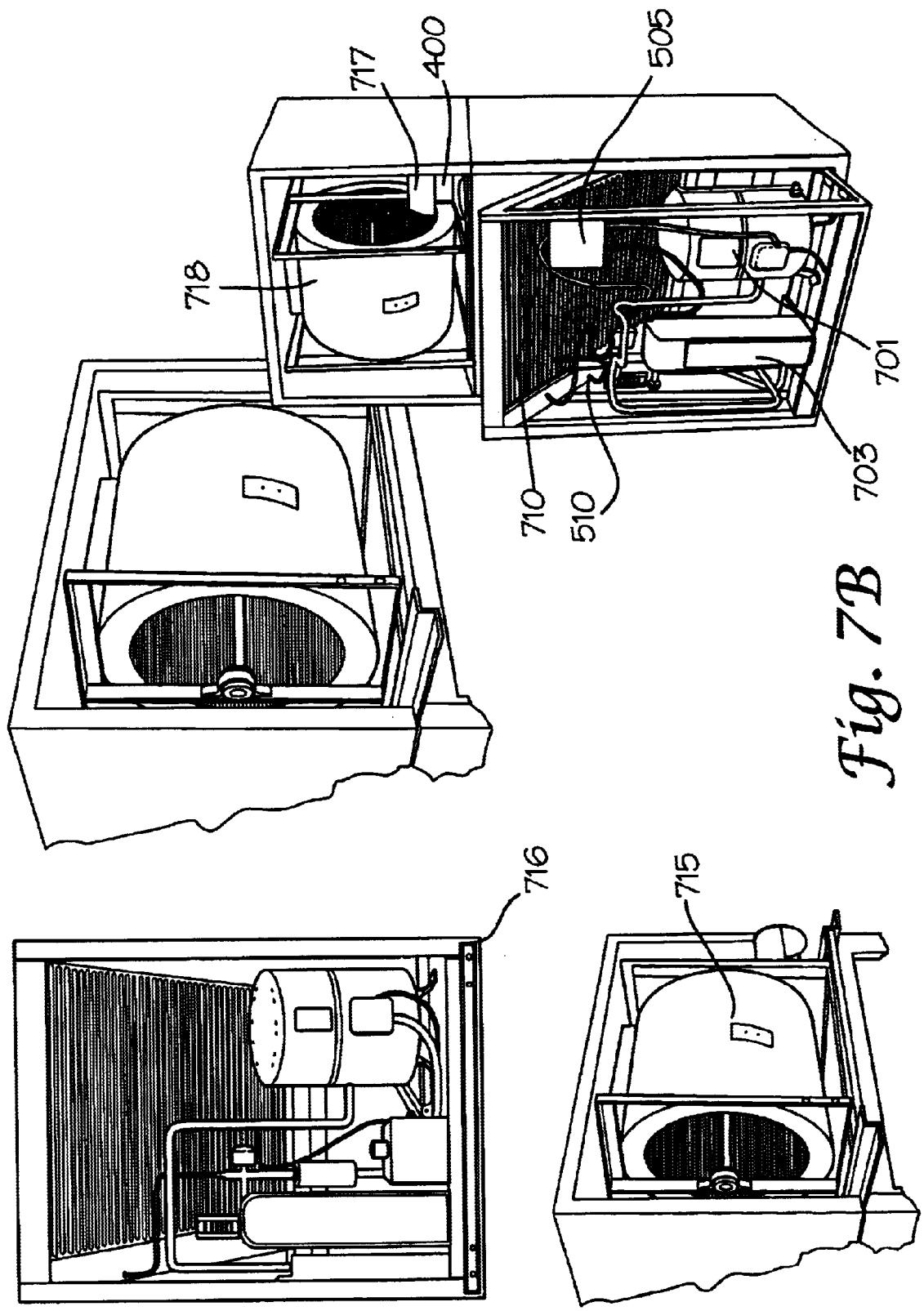
FIG. 7*b* is a picture of the upper and lower modules of a modular liquid-cooled air conditioning system of the present invention.

FIG. 7b shows one embodiment of a modular liquid-cooled air conditioning system of the present invention. As previously noted, all main system components are conventional in design and operation and may be purchased form a variety of manufacturers. An upper removable framed blower module is generally shown at 715, and a lower removable framed cooling module is generally indicated at 716. A squirrel type centrifugal blower 717 is run by a motor 718 which is affixed to a motor mount 400 (see also FIG. 4). The lower removable framed cooling module assembly 716 is shown partially removed from the cabinet 100 (see FIG. 1) to reveal a cooling coil assembly 710 affixed to a compressor 701, a condenser 703, copper tubing 510 (see also FIG. 5), and an internal electrical junction box plate 505 (see also FIG. 5a) for connecting internal components to external power. Preferably, the blower module 715 is releasably connected to an outside power supply by screw type terminal strips. However, quick-release conductive couplings, plug attachment means, detachable circuit means or their equivalents may also be used. The cooling module 716 has a similarly designed electrical connection. Preferably the cooling module 716 is releasably connected to an external source of chilled liquid or chilled air with unions. However, screw-on couplings, pressure couplings, spring-loaded poppet-type valves, self-sealing valves or similar devices are also contemplated for use. The system may be disassembled quickly for repair by disconnecting the blower unit, the cooling unit or both. In one embodiment of the present invention, the blower section is removed by: turning off the power supply, removing the upper front cover panel by removing the screws or other fixation devices present, opening the electrical control box to remove blower wires from the connection terminals, disconnecting the conduit strain relief, pushing the wires back into the chamber and sliding the blower assembly and frame out of the unit. In one embodiment of the present invention, the cooling unit may be removed by: turning off the external water and electrical supply, detaching the cover panel and removing the filter, removing the cover from the internal electrical junction box to disconnect those wires connecting the control box to the screw type terminal strips, disconnecting the conduit strain relief from the conduit connecting the junction box and control box, pushing the wires and conduit from the junction box back into the chamber, disconnecting the external water pipe unions, and sliding the cooling unit and frame out of the cabinet.

FIG. 8 shows a front view of an embodiment of a single unit 800 and a double unit 801 water-cooled or air-cooled air conditioning system of the present invention. A front upper section cover is shown at 802 and a lower unit louvered cover is shown at 803. The double unit 801 essentially comprises the combination of two single units with similar components. A removable filter 804 is located behind the louvered cover 803 to filter air drawn into the lower chamber. Optional plenums 805 are available.

Figure 9:
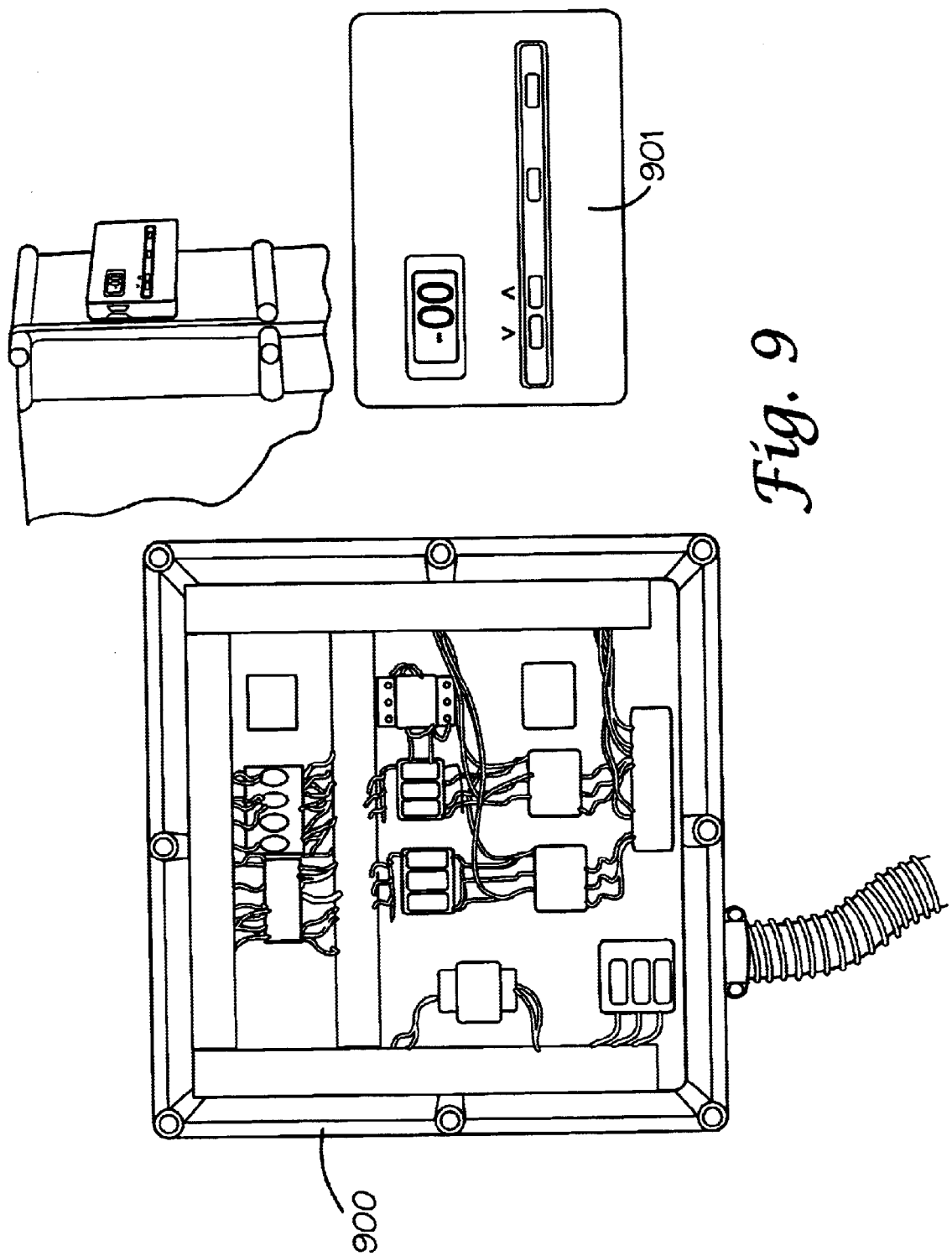
FIG. 9 is picture of the exterior NEMA-type electrical enclosure of a modular liquid-cooled air conditioning system of the present invention.

FIG. 9 shows one embodiment of the NEMA type electrical enclosure 900, which houses all exterior electrical components for the present invention. An optional temperature regulator 901 is available. Preferably, electrical connections are made with screw type terminal strips (not shown). These strips connect to the main power supply inside the NEMA enclosure and extend from the enclosure to the interior of the cabinet for connection with either the blower or cooling unit. For protection in tight quarters or where movement or vibration exists, each set of wires leading to the respective units is placed inside a corrosion resistant conduit (not shown) having corrosion resistant, watertight, strain relief connectors (not shown) disposed on either end. On one end, a strain relief connector is threaded into a coupling located on the top of the NEMA box. On the other end a strain relief connector is threaded into the side of the cabinet adjacent the NEMA box. This design provides structural support, while permitting quick disconnection of electrical connections during removal of one or more units. In any configuration, the present invention meets or exceeds requirements outlined in the National Electric Code for electrical connections.

While the present disclosure and the attached figures provide specific embodiments of the modular liquid-cooled air conditioning unit, those skilled in the art will appreciate from this disclosure that variations, modifications and equivalents of the specific device elements suggested by the present disclosure come within the scope of this invention. Thus, for example the present invention is intended to encompass new or existing systems that may be adapted for the use described herein. Different materials of construction, different environments of use, and different orientation of components come within the scope of this invention. For example, different methods of and devices for maintaining condenser pressure, such as, for example, flooding the condenser with liquid refrigerant, or using other refrigerant line piping designs are also contemplated. Additionally, the system may be adapted for use as an air-cooled air conditioning system. Simpler systems are also contemplated, such as, for example, a chilled water air handler system. In this system water is chilled by exterior cooling means and passed through an internal cooling coil assembly, wherein it absorbs heat from warm air passing over the coil. The heated water is then circulated back to the exterior cooling means where it is chilled again for subsequent redelivery to the cooling coil. This simpler systems does not require other components, such as, for example, compressor, condenser, evaporator, etc described in the more complex cooling coil module. In any design, the system may be composed of stainless steel throughout, corrosion resistant polymer throughout, galvanized steel throughout, or combinations of all three. The system may be used in non-corrosive environments where durability and ease of access are desired. Individual upper or lower units may have modified components to fit a desired purpose. The easy slide-out frames may be constructed to include any release mechanism that allows for the unit to be quickly removed from a cabinet, such as for example, modified desk drawer hinges, wheels, pulleys or similar devices. The system may be designed to fit through a standard 3-ft door, or may be combined with one or multiple systems to increase capacity. The power may be industry standard or modified to suit a particular need. Plenums can be designed into the system if required. Heavy-duty components can be substituted for more economical light duty components if the system is used in a non-industrial setting. Insulation such as, for example, fiberglass or rubber may used to insulate wiring and tubing to make the system more efficient. Standard components such as for example compressors, condensers, motors etc. can be entirely encased in corrosion resistant material, or may have such a covering only over those parts exposed to the external environment. A NEMA electrical box outlet may be configured to accommodate different electrical wire and couplings to accommodate specific needs. Accordingly, the scope of this invention should not be construed as being limited to the specifics of the detailed disclosure and best mode disclosed herein, but should be construed in light of the claims appended thereto and to the equivalents thereof.

What is claimed:

1. A modular, liquid-cooled air-conditioning system comprising:
   a. an elongate cabinet housing including top, bottom, front, rear and side walls;
   b. a framed blower assembly module, slidably mounted inside said cabinet and releasably connected to an exterior source of power, said blower assembly module adapted to transport air therethrough; and
   c. a framed cooling assembly module, slidably mounted inside said cabinet, and releasably connected to an exterior source of power and cooling fluid, said cooling assembly module adapted to decrease the temperature of air transported therethrough.

2. The system of claim 1, wherein said cabinet housing further comprises an interior and a exterior, said interior sectioned into a lower receiving chamber, and an upper receiving chamber, wherein said upper and lower receiving chambers are flow connected such that when warm air is drawn into one chamber of the cabinet housing it is conditioned, and then flows into the second chamber whereby it is exhausted to the exterior.

3. The system of claim 2, wherein said cabinet housing further comprises an air inlet opening in communication with either of said upper or lower receiving chambers, said air inlet opening in communication with an internal or external filter device, wherein said air inlet in communication with said filter device is covered by at least one louvered panel.

4. The system of claim 2, wherein said cabinet housing further comprises an exhaust opening, wherein said opening is flow connected with said upper and lower receiving chambers to allow for the transfer of air from the exterior, through an intake across said cooling module means, through said blower module means and out to the exterior.

5. The system of claim 1, wherein said cabinet housing further comprises an intake, said intake adapted to permit cool liquid or air from an exterior source into the system for use in heat exchange with an internally circulating coolant.

6. The system of claim 1, wherein said cabinet housing further comprises an outlet, said outlet adapted to release heated liquid or heated air from the interior to the exterior.

7. The system of claim 1, wherein said cabinet housing further comprises a brace for attachment of an exterior mounted electrical enclosure.

8. The system of claim 1, wherein said cabinet housing further comprises an outlet to remove condensate resulting from the conditioning of air.

9. The system of claim 1, wherein said housing is composed of corrosion resistant materials selected from the group consisting of stainless steel, marine stainless steel, galvanized steel, polymeric compositions, and combinations thereof.

10. The system of claim 1, wherein the framed blower module comprises:
    a. a three dimensional rigid frame assemblage having a blower and motor disposed and affixed thereon such that the entire assembly is movable as one unit, said assembly being releasably mounted within either an upper or lower chamber;
    b. said blower unit being capable of directing an outside air stream through an air inlet opening into said chamber containing said cooling unit for conditioning, through said chamber containing said blower unit, and out through an air duct;
    c. said blower unit being connected to a drive system selected from the group consisting of a belt drive, direct drive and combination thereof; and
    d. said blower unit being selected from the group consisting of a squirrel-cage centrifugal blower, a fan and combinations thereof.

11. The system of claim 10, wherein components of said blower module are constructed of corrosion-resistant materials selected from the group consisting of stainless steel, marine stainless steel, galvanized steel, polymeric metal composition, and combinations thereof.

12. The system of claim 10, wherein said components of said blower module are coated with corrosion-resistant material.

13. The system of claim 12, wherein said corrosion-resistant material is selected from the group consisting of Heresite, Bronzeglow, Adsil, and combinations thereof.

14. The system of claim 1, wherein said framed cooling module comprises:
    a. a compressor to compress low-pressure gas;
    b. an internal coolant capable of absorbing heat from warm air passing through the system;
    c. an evaporator and cooling coil assemblage designed to transfer heat from the air to the internal coolant, wherein said transfer of heat causes said internal coolant to change phases from a liquid to a vapor;
    d. a liquid-cooled or air-cooled condenser, wherein heat absorbed by said internal coolant is transferred to an external cooling fluid for release to an outdoor environment; and
    e. a drip-pan positioned at the base of said cooling coil to collect condensate resulting from contact of warm air with said cooling coil.

15. The system of claim 14, wherein said components of said framed cooling module are constructed of corrosion-resistant materials.

16. The system of claim 15, wherein said corrosion resistant material is selected from the group consisting of stainless steel, marine stainless steel, galvanized steel, polymeric metal composition, and combinations thereof.

17. The system of claim 14, wherein said components of said framed cooling module are coated with corrosion-resistant materials.

18. The system of claim 17, wherein said corrosion-resistant materials are selected from the group consisting of Heresite, Bronzeglow, Adsil, and combinations thereof.

19. An air conditioning system according to claim 1, wherein the cooling module is modified for use with chilled fluid in heat exchange processes, said modified cooling module comprising:
    a. cooling coil assemblage designed to transfer heat from warm air entering said system to chilled fluid circulating through said coil assemblage;
    b. a fluid flow control valve connected to an external source of chilled fluid, said control valve capable of regulating the amount of chilled fluid entering and leaving said cooling coil assembly; and c. a drip-pan positioned at the base of said cooling coil to collect condensate resulting from contact of warm air with said cooling coil.

20. The system of claim 1, wherein said housing, said blower module and said cooling module are constructed of corrosion-resistant materials selected from the group consisting of stainless steel, marine stainless steel, galvanized steel, polymeric metal composition, and combinations thereof.

21. The system of claim 1, wherein said housing, said blower module and said cooling module are coated with corrosion-resistant materials selected from the group consisting of Heresite, Bronzeglow, Adsil, and combinations thereof.

22. In an improved modular air-conditioning system comprising a cabinet housing, blower module means adapted to transport air therethrough, and a cooling module means adapted to condition air passing therethrough, said blower module means and said cooling module means being flow connected, the improvement comprising:

a. upper and lower framed blower and cooling modules, slidably mounted for insertion into either an upper or lower chamber of said cabinet housing;
   b. said framed cooling module comprising a compressor, condenser; evaporator, cooling coil, coolant, drip pan, and connections to exterior sources of power and cooling fluid;
   c. said framed blower module comprising a blower connected to a motor and connections to an external source of power; and
   d. said blower and said cooling modules being releasably connected to exterior sources of power or fluid for quick release from said chamber for repair or maintenance.

23. A modular liquid-cooled air conditioning system comprising:

a. a housing means to contain system components;
   b. a releasably connected blower module means adapted to transport air therethrough;
   c. a releasably connected cooling module means adapted to change the temperature of air transported therethrough;
   d. said blower module means and said cooling module means being flow connected to allow for the transfer of air from the exterior, through an intake across said cooling module means through said blower module means and out to the exterior; and
   e. an internal circulating cooling means adapted to absorb heat from warm air entering said system, wherein said internal cooling means is in communication with an external cooling means, said external cooling means utilizes liquid coolant adapted to absorb heat from said internal cooling means, said heat being released to the exterior environment.

24. A method for cooling a structure with a modular air conditioning system having an exterior and an interior, comprising:

a. providing a cabinet comprising:
      i. upper and lower module receiving chambers inside said cabinet in communication internally and externally of said housing;
      ii. an air intake opening in said cabinet in communication with said chamber and with said interior to draw warm air from an exterior space to an interior space for conditioning;
      iii. an exhaust opening in said cabinet, wherein said opening is flow connected with said upper and lower receiving chambers to allow expulsion of conditioned air from said interior to said exterior;
   b. placing framed, slidably mounted blower and cooling modules, releasably connected to external sources of power and liquid coolant within said chambers of said cabinet;
   c. causing warm air to be drawn into said system by blower means adapted for circulating air through said system;
   d. causing said warm air to contact said cooling unit whereupon heat is drawn from said warm air and absorbed by internal coolant material circulating inside said cooling module unit causing said warm air to quickly decrease in temperature; and
   e. causing the conditioned air to flow over the cooling unit toward the blower unit into the exhaust opening for expulsion to the external environment, surrounding said system.

25. A method for reducing maintenance-related downtime of an air conditioning system comprising:

a. providing a modular air conditioning system adapted for quick interchange of component parts, said system comprising:
      i. a cabinet housing having upper and lower removable front access panels, said access panels covering upper and lower module receiving chambers;
      ii. a removable, slidably mounted framed blower module, said blower module releasably connected to an external source of power; and
      iii. a removable, slidably mounted framed cooling module, said cooling module releasably connected to external sources of cool liquid, and power;
   b. removing upper or lower front access panels from said cabinet through operation of releasable fixation devices, said fixation devices selected from the group consisting of screws, hex-nuts, butterfly-nuts, spring mounts, and combinations thereof;
   c. disconnecting system components contained within said blower module, said cooling module, or both from external sources of power and cool fluid through operation of releasable electrical, fluid or gas couplings;
   d. sliding said framed module containing inoperable system component from said receiving chamber;
   e. inserting a standby framed module containing a complete operational system into the chamber from which the defective module was removed;
   f. re-connecting internal system components to external sources of power and/or cooling fluid as required; and
   g. re-attaching said upper and/or said lower front cabinet cover.

* * * * *

UNITED STATES PATENT AND TRADEMARK OFFICE
CERTIFICATE OF CORRECTION

PATENT NO.    : 6,662,588 B2
DATED         : December 16, 2003
INVENTOR(S)   : Thomas L. Houk et al.

It is certified that error appears in the above-identified patent and that said Letters Patent is hereby corrected as shown below:

<u>Title page,</u>
Item [75], please correct the names of the inventors to read:

-- Thomas L. Houk
   Carroll D. Wright --

Signed and Sealed this

Thirteenth Day of April, 2004

JON W. DUDAS
*Acting Director of the United States Patent and Trademark Office*